United States Patent [19]

Verhoeven et al.

[11] Patent Number: 4,818,304
[45] Date of Patent: Apr. 4, 1989

[54] METHOD OF INCREASING MAGNETOSTRICTIVE RESPONSE OF RARE EARTH-IRON ALLOY RODS

[75] Inventors: John D. Verhoeven; O. Dale McMasters; Edwin D. Gibson; Jerome E. Ostenson; Douglas K. Finnemore, all of Ames, Iowa

[73] Assignee: Iowa State University Research Foundation, Inc., Ames, Iowa

[21] Appl. No.: 110,974

[22] Filed: Oct. 20, 1987

[51] Int. Cl.$^4$ .............................................. H01F 1/02
[52] U.S. Cl. ..................................... 148/103; 148/108
[58] Field of Search ....................... 148/103, 108, 121; 75/65 ZM

[56] References Cited

U.S. PATENT DOCUMENTS 4,152,178  5/1979  Malekzadeh et al. .............. 148/103
4,274,888  6/1981  Schnurbus et al. ................ 148/108

OTHER PUBLICATIONS

Verhoeven, J. D., Gibson, E. D., McMasters, O. D., Baker, H. H., "The Growth of Single Crystol Terfenol-D Crystals", *Met. Trans.*, 118A:223-231 (1987).

*Primary Examiner*—John P. Sheehan
*Attorney, Agent, or Firm*—Tilton, Fallon, Lungmus & Chestnut

[57] ABSTRACT

This invention comprises a method of increasing the magnetostrictive response of rare earth-iron (RFe) magnetostrictive alloy rods by a thermal-magnetic treatment. The rod is heated to a temperature above its Curie temperature, viz. from 400° to 600° C.; and, while the rod is at that temperature, a magnetic field is directionally applied and maintained while the rod is cooled, at least below its Curie temperature.

9 Claims, 1 Drawing Sheet

METHOD OF INCREASING MAGNETOSTRICTIVE RESPONSE OF RARE EARTH-IRON ALLOY RODS

CONTRACTUAL ORIGIN OF INVENTION

The United States Government has rights in this invention pursuant to Contract No. W-7405-ENG-82 between the U.S. Department of Energy and Iowa State University, Ames, Iowa.

FIELD OF INVENTION

The field of this invention is magnetostrictive alloys and the manufacturing of rods therefrom. This invention is particularly concerned with increasing the magnetostrictive response of rare earth-iron alloy magnetostrictive rods.

BACKGROUND OF INVENTION

In recent years considerable research has been devoted to the development of magnetostrictive compounds, and in particular rare earth-iron alloys. These developments are summarized by A. E. Clark, Chapter 7, pages 531–589, in "Ferromagnetic Materials", Vol. 1 (Ed. E. P. Wohlfarth, North-Holland Pub. Co., 1980). A major objective of the research has been to develop rare earth-iron alloys with large room temperature magnetostriction constants. Technically important alloys having these properties include alloys of terbium together with dysposium and/or holmium. The relative proportions of the rare earths and the iron are varied to maximize room temperature magnetostriction and minimize magnetic anisotropy. Presently, the most technically advanced alloy of this kind is represented by the formula $Tb_xDy_{1-x}Fe_{1.5-2.0}$ wherein x is a number from 0.27 to 0.35. An optimized ratio is $Tb_{0.3}Dy_{0.7}Fe_{1.9}$ which is known as terfenol-D, as described in U.S. Pat. No. 4,308,474.

Such rare earth-iron alloys are true compounds and can exist in crystalline or polycrystalline form. In preparing elongated bodies (viz. rods) from such alloys, grain-orientation of the crystals is essential for achieving high magnetostriction. An axial grain orientation of the crystallites not only increases the magnetostriction constant but also reduces internal losses at the grain boundaries. This is particularly important in applications where a high magnetostriction at low applied fields is required. (See Clark, cited above, pages 545–547).

As cast magnetostrictive rods, such as those formed from the Terfenol-type alloy, can be processed by a "float zone" method, as described in McMasters U.S. Pat. No. 4,609,402. The as-cast rod is subjected to progressive zone melting and resolidification. In optimized embodiments of this method, the resulting rod is essentially a single elongated crystal extending for the length of the rod. The longitudinally-aligned single crystals have a $<112>$ direction parallel to the growth axis, and twin plane boundaries running perpendicular to the $<\bar{1}11>$ direction of the crystal. [See Verhoeven, et al. (1987), *Met. Trans.*, 118A: 223–231.] As described by Verhoeven, et al. magnetostrictive rods with generally similar properties can be produced by a directional freezing technique in which a liquified column of the alloy is progressively solidified. That procedure results in aligned polycrystals with a $<112>$ direction nearly parallel to the growth axis. Single crystal rods produced by the float zone method, and polycrystalline rods produced by the zone solidification method exhibit comparable magnetostrictive responses as originally produced, both when uncompressed and when subjected to axial compression.

Because of the much greater response of compressed rods, it has been the practice to employ magnetostrictive rods under a high degree of compression. However, it has been desired to produce rods which can provide an adequate response at less applied pressure, or optimally at zero pressure. Such rods would facilitate the use of lower strength magnetic fields, and less current would be needed.

McMasters U.S. Pat. No. 4,609,402 states that the as-cast rods may be subjected to heat treatment to obtain phase equilibrium (col. 7, lines 16–20). This disclosure reads: "The directionally oriented rods may be heat treated in a vacuum tube furnace chamber to achieve phase equilibria. This can be accomplished at 950° C. for a period of five days. A slow cool down period, usually overnight, is desirable in order to avoid cracking." Such heat treatment tends to improve magnetostrictive response of compressed rods, but the uncompressed response remains of the same order. Heretofore, no method has been known for producing magnetostrictive rods which exhibit a magnetostrictive strain when uncompressed of comparable magnitude to that obtained under compression.

SUMMARY OF INVENTION

This invention comprises a method of increasing the response of a rare earth-iron (RFe) alloy rod by a thermal-magnetic teatment. The rod is heated to a temperature above its Curie temperature, viz. from 400° to 600° C.; and, while the rod is at that temperature, a magnetic field is directionally applied and maintained while the rod is cooled, at least below its Curie temperature.

It is critical to employ rods which are essentially in the form of a longitudinally-aligned single crystal having twin plane boundaries running generally perpendicular to the transverse $<111>$ direction of the crystal, and to apply the magnetic field in a direction perpendicular to the twin boundaries. While continuing to apply the field, the rod is cooled to a temperature below its Curie temperature, which is the lowest temperature at which the magnetic vectors line up.

By the method of this invention, the magnetostrictive response of single crystal rods can be dramatically increased, and this increased response can be observed with the rod uncompressed as well as under compression. An uncompressed single crystal Terfenol rod originally having an uncompressed magnetostrictive parameter of the order of 800–900 ppm exhibited an increase response of the order of 1900–2000 ppm when treated by the method of this invention. Such a response level is as high as any heretofore obtained with as-cast or heat-treated rods under high pressure. This result therefore represents an important advance in the art of manufacturing magnetostrictive rods.

THE DRAWINGS

To assist in understanding the method of this invention, a drawing is provided in which:

FIG. 1 is a diagrammatic elevational view of an apparatus for carrying out the combined thermal-magnetic treatment; and FIG. 2 is a diagrammatic illustration of the desired relation of the applied magnetic field to the crystal structure of the rod.

DETAILED DESCRIPTION

Figure 1:
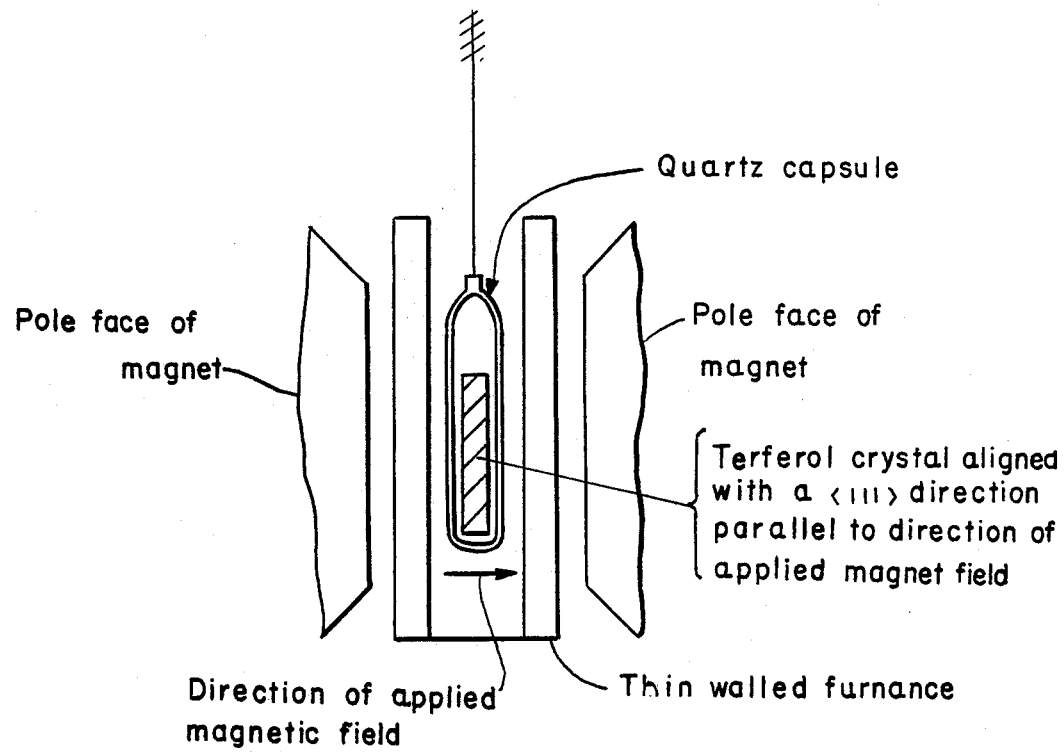

The method of the present invention is applicable generally to $RFe_x$ alloy magnetostrictive rods, where R is one or more rare-earth metals, Fe is iron, and x is a number from 1.5 to 2.0. In preferred embodiments, the magnetostrictive alloy is formed of iron and terbium (Tb) together with dysprosium (Dy) and/or holmium (Ho). Based on the present state of the art, the Terfenol-type alloys are believed to be optimum. Such alloys are represented by the formula $Tb_xDy_{1-x}Fe_{1.5-2.0}$, wherein x is a number from 0.27 to 0.35. In preparing these alloys, commercial grades of electrolytic iron and purified rare-earth metals are employed. Preferably the metals should have purities of at least 99.9% by weight.

A method for forming and casting magnetostrictive alloy rods is described in McMasters U.S. Pat. No. 4,609,402. After cleaning, the metal constituents are weighed and alloyed by means of a conventional arc-melter. Buttons or fingers thus formed are charged to a melting crucible, and within the crucible there is formed a molten homogeneous body of the rare earth-iron alloy. As described in the cited patent, the molten alloy may be pushed out of the crucible by argon pressure into quartz tubes, and solidified therein to cast the rods.

The "as-cast" rods can be subjected to progressive zone melting and resolidification to obtain an axial grain orientation, and convert the rods to essentially single crystal form. The rods, for example, may be in the form of elongated cylindrical bodies having diameters of 0.5 to 1.2 cm and lengths from 15 to 25 cm. When the as-cast polycrystalline rods are subjected to progressive zone melting, the rods may be aligned vertically with their sides unsupported, and the melt zone may be moved upwardly along the rods from their lower to their upper end. The size of the melt zone and its rate of upward movement are controlled to maintain the shape of the rod. For further details, reference may be had to the cited patent, which includes an illustration of an apparatus for carrying out the zone melting and resolidification.

Single crystal magnetostrictive rods produced as described comprise the starting material for practicing the present invention. These rods are essentially composed of longitudinally-aligned single crystals having twin plane boundaries running generally perpendicular to the transverse <111> direction of the crystal, and the <112> direction is parallel to the rod axis. The twin planes can be observed by metallographic examination. [See Verhoeven, et al. (1987), Metall. Trans, 18A: 220-231.]

In practicing the method of this invention, the rod is heated to a temperature above its Curie temperature. For Terfenol-type alloys, the Curie temperature is around 350° C. Heating of the rods to a temperature above their Curie temperature, such as in the range from 400°-600° C. is therefore sufficient. While the rod is at a temperature above its Curie temperature, a magnetic field of from around 5000 to 15,000 gauss is applied. The direction of the field should be at least approximately perpendicular to the twin plane boundaries. The rod is then cooled to a temperature below its Curie temperature while continuing to apply the magnetic field. The rod may be cooled to ambient room temperature.

Although the optimum temperatures and applied magnetic fields may vary with the specific magnetostrictive alloy being processed, it is believed that the preferred heating temperatures are in the range of about 425°-475° C., and preferred field strengths in the range of from about 7000 to 9000 gauss. These ranges can be advantageously used with the preferred Terfenol-type alloys, as represented by the formula $Tb_xDy_{1-x}Fe_{1.5-2.0}$, wherein x is a number from 0.27 to 0.35. Since heated magnetostrictive alloys are highly reactive, the rods should be protected from chemical reaction while they are being processed. For example, they can be encapsulated in quartz tubes under inert gas or vacuum. Argon or helium are suitable inert gases.

The heating and cooling of the rods is preferably carried out gradually, that is, slow heating and cooling are desirable for best results. One simple procedure is to introduce the encapsulated rods into a cold furnace, such as an electric resistance furnace, and permit the rods to heat as the furnace heats up. The rods may be cooled in the furnace as the furnace cools down after turning off the heating element.

The practice of this invention is further illustrated by the accompanying drawing. FIG. 1 illustrates a thin-walled electric resistance furnace in which there is suspended a quartz capsule containing a Terfenol single crystal rod. Magnetic pole faces are in opposed alignment on opposite sides of the furnace. The magnetic field is thereby applied with the field vector at right angles to the rod axes, as indicated by the arrow in FIG. 1.

Figure 2:
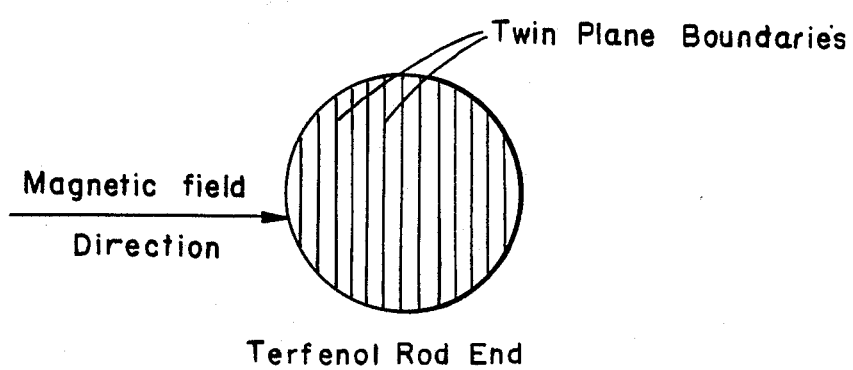

FIG. 2 illustrates the desired relation of the twin plane boundaries of the single crystal rod to the applied magnetic field. With reference to the Terfenol rod end (or transverse section), the twin plane boundaries are perpendicular to the transverse <111> and the applied magnetic field is oriented perpendicular to the twin plane boundaries. The magnetic field is thereby applied along an easy axis of magnetization.

Prior to the magnetic treatment, one end or transverse section of the twinned single crystal with a <112> axial direction can be prepared by a standard electropolish. The parallel twin planes are located by metallographic examination, and their direction can be marked on the surface with a scratch. The sample is then encapsulated in quartz under Ar, and held vertically in a thermal-magnetic apparatus, such as that of FIG. 1. The sample is placed in the apparatus such that the scratch locating the twin plane orientation is perpendicular to the applied magnetic field vector. This orientation places the <111> direction, which is perpendicular to the twin planes, parallel to the applied magnetic field. The furnace is now turned on and the sample is furnace heated, for example, to about 450° C. The magnetic field is applied held, for example, for one hour. Then the rod can be "furnace cooled" with the field on, that is, the furnace is turned off and allowed to cool with the rod remaining in the furnace.

The method of this invention and the results obtainable are further illustrated by the following experimental examples.

EXPERIMENTAL EXAMPLES

A Terfenol $Tb_{0.3}Dy_{0.7}Fe_{1.9}$ alloy as-cast rod was processed by float zone melting and resolidification to produce a twinned single crystal with a <112> direction parallel to the growth axis (diameter=6 mm, length=5 cm).

The single crystal rod was encapsulated in a tantalum container under an argon atmosphere and placed inside of argon-containing quartz tube. The encapsulated rod was heated to 950° C., held 1 hour, and then air cooled. The magnetostrictive parameters before and after the heat processing are compared below in Table A.

TABLE A

Magnetostrictive Parameters of Terfenol Rods

| Sample | P = 0 ksi[3] | | P = 2 ksi[3] | |
|---|---|---|---|---|
| | $\lambda$ (2.5, P)[1] | $\lambda$/H (max)[2] | $\lambda$ (2.5, P) | $\lambda$/H (max) |
| As-Cast | | | | |
| Single crystal | 1440 ppm | 1.40 ppm/Oe | 1680 ppm | 1.10 ppm/Oe |
| Heat Treated | | | | |
| Single Crystal | 860 ppm | 1.1 ppm/Oe | 1940 ppm | 2.64 ppm/Oe |

[1]$\lambda$ is the axial magnetostrictive strain in ppm.
[2]H is the magnetic field, and $\lambda$/H is the ratio of strain to field strength in ppm/Oe.
[3]Axial compression in ksi.

(B) Thermal-Magnetic Treatment

An as-cast single crystal Terfenol $Tb_{0.3}Dy_{0.7}Fe_{1.9}$ rod, which had been heat-treated as described above, was reheated to 450° C. for 1 hour, and a magnetic field of 9250 Oe was applied perpendicular to its axis and parallel to its <111> direction lying at 90° to its axis. The sample was furnace cooled to room temperature under the same applied magnetic field. After this thermal-magnetic treatment the measured parameters changed to those given in Table B.

TABLE B

Magnetostrictive properties after thermalmagnetic processing.

| Sample | P = 0 ksi | | P = 2 ksi | |
|---|---|---|---|---|
| | $\lambda$ (2.5, P) | $\lambda$/H (max) | $\lambda$ (2.5, P) | $\lambda$/H (max) |
| Single crystal | 1945 ppm | 5.1 ppm/Oe | 2006 ppm | 1.89 ppm/Oe |

By comparing Tables A and B it can be seen that the uncompressed response was increased from 860 ppm to 1945 ppm, and the compressed response was increased from 1940 ppm to 2006 ppm.

We claim:

1. A method of processing an $RFe_x$ alloy magnetostrictive rod to increase its magnetostrictive response, where R is one or more rare earth metals, Fe is iron, and x is a number from 1.5 to 2.0, said rod being essentially in the form of a longitudinally aligned single crystal having twin plane boundaries running generally perpendicular to the <111> direction of the crystal, comprising the steps of:

(a) heating said rod to a temperature above its Curie temperature and in the range from 400° to 600° C. while protecting the rod from chemical reaction;

(b) while said rod is at said temperature, directionally applying a magnetic field of from 5,000 to 15,000 gauss, the direction of said field being at least approximately perpendicular to said twin plane boundaries; and (c) cooling said rod to a temperature below its Curie temperature while continuing to apply said field.

2. The method of claim 1 in which said $RFe_x$ alloy is formed from iron and terbium (Tb) together with dysprosium (Dy) and/or holmium (Ho).

3. The method of claim 1 in which said $RFe_x$ alloy is represented by the formula $Tb_xDy_{1-x}Fe_{1.5-2.0}$ wherein x is a number from 0.27 to 0.35.

4. The method of claims 1, 2, or 3 in which said rod in step (a) is heated to a temperature of about 425° to 475° C.

5. The method of claims 1, 2, or 3 in which a magnetic field of from about 7000 to 9000 gauss is applied in step (b) to said heated rod.

6. A method of processing a rod formed from a magnetostrictive alloy of iron and terbium (Tb) together with dysprosium (Dy) and/or holmium (Ho) to increase its magnetostrictive response, said rod being essentially in the form of a longitudinally aligned single crystal having twin plane boundaries running generally perpendicular to the <111> direction of the crystal, comprising the steps of:

(a) slowly heating said rod to a temperature from about 425° to 475° C. while protecting the rod from chemical reaction;

(b) while said rod is at said temperature, directionally applying a magnetic field of from 7,000 to 9,000 gauss, the direction of said field being perpendicular to the twin plane boundaries; and (c) cooling said rod to a temperature below its Curie temperature while continuing to apply said field.

7. The method of claim 6 in which said magnetostrictive alloy is represented by the formula $Tb_xDy_{1-x}Fe_{1.5-2.0}$ wherein x is a number from 0.27 to 0.35.

8. The method of claim 6 in which said magnetostrictive alloy is represented by the formula $Tb_{0.3}Dy_{0.7}Fe_{1.9}$.

9. The method of claim 1 or claim 6 in which said rod prior to the claimed treatment is heat-treated to promote phase equilibria.

* * * * *